United States Patent [19]

Nelson

[11] 4,127,859
[45] Nov. 28, 1978

[54] INTEGRATED CIRCUIT SUBSURFACE ZENER DIODE

[75] Inventor: Carl T. Nelson, Sunnyvale, Calif.

[73] Assignee: National Semiconductor Corporation, Santa Clara, Calif.

[21] Appl. No.: 772,375

[22] Filed: Feb. 25, 1977

[51] Int. Cl.² .......................................... H01L 29/90
[52] U.S. Cl. .................................... 357/13; 357/40; 357/48; 357/89
[58] Field of Search ..................... 357/13, 40, 48, 89

[56] References Cited

U.S. PATENT DOCUMENTS 3,881,179  4/1975  Howard, Jr. ...................... 357/13

OTHER PUBLICATIONS

Robert C. Dobkin, "On-Chip Heater Helps to Stabilize Monolithic Reference Zener", Electronics, Sep. 16, 1976, pp. 106-112.

*Primary Examiner*—Stanley D. Miller, Jr.
*Assistant Examiner*—James W. Davie
*Attorney, Agent, or Firm*—Gail W. Woodward

[57] ABSTRACT

A zener diode is incorporated into a conventional integrated circuit without changing the process. The structure employed produces a diode that breaks down in a subsurface region, thus avoiding the noise and instabilities that attend surface breakdown. An isolation diffusion is employed to make the anode and an NPN transistor emitter diffusion is employed to provide the cathode. If the emitter diffusion diameter is larger than the oxide cut used to achieve isolation predeposition and is concentric therewith, the resulting zener diode will have its breakdown region confined to under the emitter diffusion. The diode action is thereby remote from surface junction breakdown effects.

6 Claims, 6 Drawing Figures

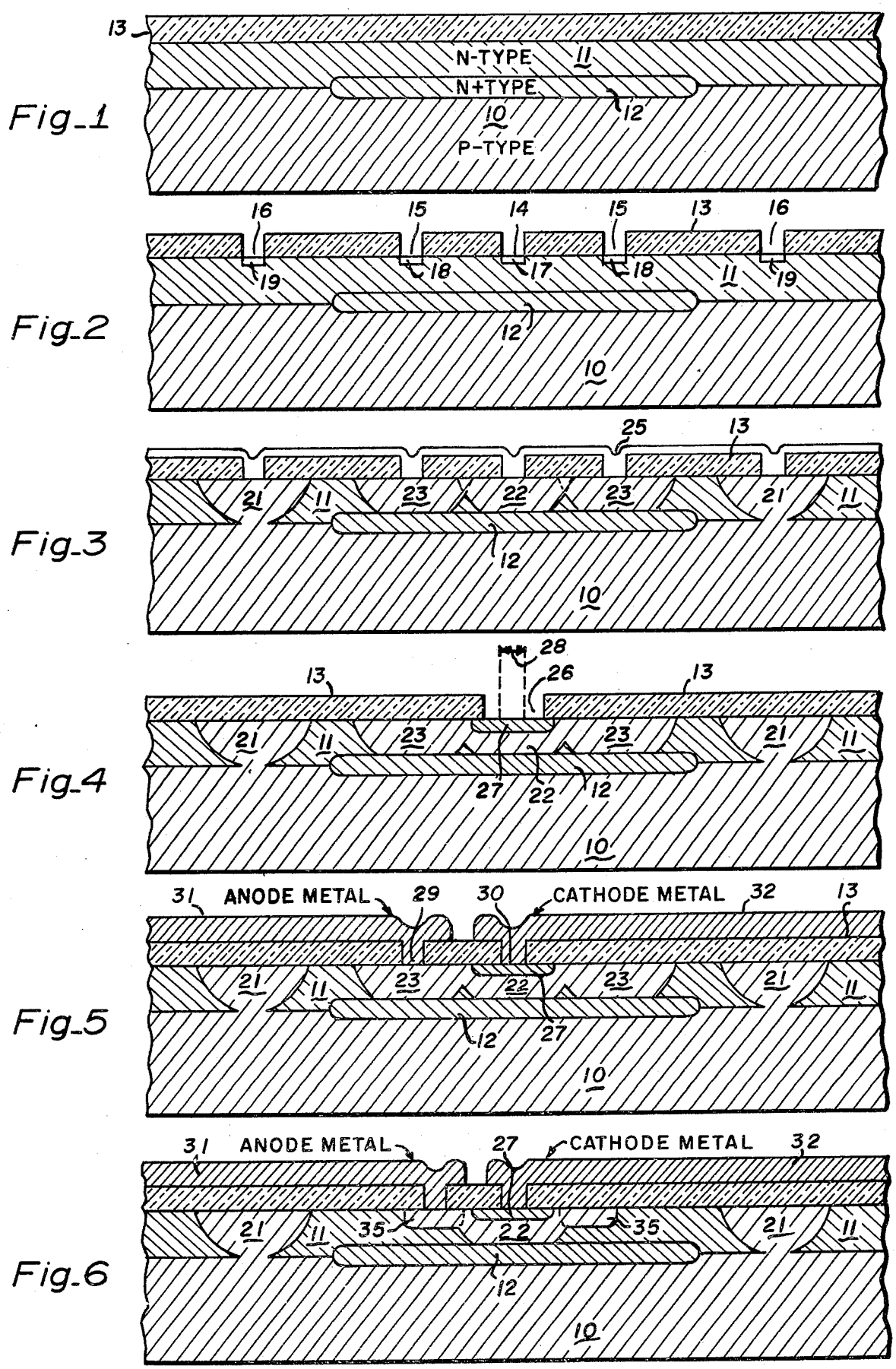

INTEGRATED CIRCUIT SUBSURFACE ZENER DIODE

BACKGROUND OF THE INVENTION

Zener diodes are often used in monolithic integrated circuit IC design. Typically an NPN transistor emitter-base junction is used as a zener diode. The breakdown voltage of such a structure is in the vicinity of 5 to 10 volts. Such a diode will be controlled by its uppermost periphery, which occurs at the semiconductor surface under the passivating oxide. It has been found that surface effects act to alter the diode breakdown characteristic with time and tend to make the diodes noisy in the breakdown region.

From a circuit standpoint, it is often useful to employ a zener diode to produce a constant potential that is less than the transistor emitter-base diode breakdown. It would be extremely useful to be able to incorporate zener diodes having a breakdown in the 2 to 6 volt range into IC designs. Accordingly, many IC manufacturing processes incorporate a series of extra steps in which the zener diodes are produced. Some of these processes employ two-step epitaxial depositions with diffusions applied between depositions. Other processes involve extra diffusion steps to make the zener diodes. In these special process approaches care is taken to ensure that the zener diode is such that breakdown is confined to a region below the semiconductor surface. It is clear that any process employing extra steps is expensive and subject to yield reductions. Since there is more complexity, more things can go wrong and more process controls and testing must be employed.

SUMMARY OF THE INVENTION

It is an object of the invention to provide zener diodes in an IC structure having a subsurface breakdown that can be controlled in the 2 to 6 volt range without altering the conventional IC process.

It is a further object of the invention to provide a subsurface IC zener diode having a small controlled area and therefore a reliable low voltage breakdown characteristic.

These and other objects are achieved using conventional IC process of the kind employing a single epitaxial layer and top surface isolation diffusion. In the conventional IC process, isolation diffusion occurs following epitaxial deposition. Where a zener diode is to be fabricated, a conventional buried layer is employed. If desired, the diode region is surrounded by an isolation ring. The zener diode anode is formed by an isolation type diffusion which lies inside the isolation ring and in registry with the buried layer so that the diffusion is stopped by the buried layer to prevent its contacting the substrate. During conventional emitter diffusion the diode cathode is established. An emitter diffusion is centered within the confines of the diode anode diffusion, but outside the original isolation oxide cut. Since the isolation diffusion results in a radially graded resistivity which is lowest in its central portion, the emitter diffusion that overlies the isolation diffusion will produce a P-N junction diode having the lowest breakdown voltage at its center. This means that any current carried by the diode will flow largely in the center of the diode with the peripheral portion carrying very little current. This also means that the actual zener diode is a subsurface breakdown structure. The diode portion that intersects the semiconductor surface has a higher breakdown voltage. Thus the surface will have very little effect on the diode characteristics both in terms of zener voltage and noise induced by fluctuating surface currents. In addition, the actual diode is smaller than the emitter diffusion which means that the current density can be made large even though the cathode itself is relatively large. This ensures a sharp breakdown characteristic in a structure that is easy to contact.

To make ohmic contact to the anode either one of two approaches can be used. In the first approach a second isolation type of diffusion is located in registry with the buried layer and spaced from the first or anode diffusion so that after the diffusion is completed the outer edges merge to make ohmic contact. The second diffusion is then available for a metal contact to connect the anode with the rest of the IC components. In the preferred embodiment the anode contact is made in the form of a concentric ring spaced so that the inner periphery of the ring merges with the outer periphery of the anode.

In the second contact approach the anode diffusion is contacted with an adjacent diffusion of NPN transistor base character. The base diffusion only passes part way through the epitaxial layer and thus does not need to be in registry with the buried layer. However, in general, the base diffusion has a higher resistance characteristic and therefore ordinarily constitutes a second choice. In the case where anode to epitaxial layer parasitic capacitance is a problem, this second approach may be advantageous. As was the case in the first approach, it is preferred that the base diffusion surrounds and overlaps the periphery of the anode but is stopped short of contact with the cathode diffusion. The conventional metal contact is made to the base diffusion.

BRIEF DESCRIPTION OF THE DRAWING

FIG. 1 is a cross section of a portion of an IC wafer showing the starting material for diode fabrication;

FIG. 2 shows the wafer of FIG. 1 after oxide cut and diffusion predeposition;

FIG. 3 shows the wafer of FIG. 2 after isolation diffusion drive-in;

FIG. 4 shows the wafer of FIG. 3 after an emitter diffusion is used to establish the diode cathode;

FIG. 5 shows the wafer of FIG. 4 after metal electrodes have been applied to anode and cathode; and FIG. 6 shows an alternative means for making contact to the diode anode.

DESCRIPTION OF THE INVENTION

In the description that is to follow the processes are all wellknown in the integrated circuit (IC) fabrication art. The diffusions described for isolation are used to create the well-known in-diffused walls that form P-N junction isolation pockets or tubs in the wellknown epitaxial layer located upon an opposite conductivity substrate or starting wafer. Other diffusions relate to conventional transistor emitter and base diffusions used to create the conventional bipolar transistors. The drawings are not to scale but are distorted. Particularly the vertical dimension is expanded for clarity of illustration. While only one diode is shown, it is to be remembered that this diode is a part of an associated circuit which can include a plurality of such diodes and other parts. The circuit is only one of a plurality being fabricated simultaneously on a semiconductor wafer. Thus the drawing will represent only a very small fraction of a semiconductor wafer being subjected to a series of process steps. The process to be described will be reproduced on the wafer at each point where a zener diode is desired.

FIG. 1 shows a conventional IC under construction part way through the fabrication process. A P-type substrate 10 has an N-type epitaxial layer 11 grown thereon. Prior to epitaxial deposition, a conventional heavily doped N-type buried layer 12 is established in the structure. Such a buried layer is conventionally employed in IC construction under the region that will contain an active transistor to improve certain electrical characteristics. A conventional planar device oxide layer 13 is established on the upper surface of epitaxial layer 11.

FIG. 2 illustrates a process step that would ordinarily be associated with isolation diffusion. Cuts have been made photolithographically through oxide layer 13 at 14 which represents a small hole, 15 which represents a concentric ring around hole 14, and 16 which represents a larger concentric ring around ring 15. These rings can be round, square, oval, or any other suitable shape as desired and may be closed or left partially open.

After the oxide cuts are made the wafer is subjected to an atmosphere that contains P-type impurities, typically a compound of boron, so that regions 17, 18 and 19 are heavily doped with boron. Then the wafer is subjected to the isolation diffusion drive in which the P-type impurities are diffused completely through epitaxial layer 11 and into contact with substrate wafer 10. FIG. 3 shows the cross section of the wafer after the isolation diffusion drive-in step. Region 19 of FIG. 2 has diffused and expanded to become region 21 which, being a ring, completely isolates a tub of N-type epitaxial layer 11 within its inner confines.

Region 17 has diffused and expanded to become region 22 and region 18 has diffused and expanded to become region 23. However, it can be seen that buried layer 12 will act to terminate regions 22 and 23 so that they do not merge with substrate 10 as does region 21. Furthermore regions 22 and 23 have expanded to merge their peripheries as shown by the dashed portions. It can be seen that an enlarged central P-type region now exists within the N-type epitaxial layer 11 and is fully isolated by the surrounding N-type material which is in turn surrounded by P-type material thereby providing a P-N junction isolated structure.

As shown in FIG. 3, the isolation diffusion drive-in results in oxide layer regrowth as is conventional in the planar process. The regrown layer 25 fills the original oxide cuts. Thus the planar oxide is maintained. If desired after drive-in, the entire oxide can be removed and a new planar oxide regrown. Alternatively this stripping step can be dispensed with and the oxide formed as shown in FIG. 3 used in the subsequent processing steps.

In the IC processing several steps may intervene but, since the wafer portion being described is covered with the planar oxide, nothing of significance occurs to the structure illustrated. The next step of importance here occurs when the NPN transistor emitters are to be diffused. As shown in FIG. 4 an oxide cut 26 is photolithographically established and an N-type emitter diffusion applied to produce a heavily doped N-type region 27. Region 27 is produced in registry with the central part of P-type region 22 so that a P-N junction is created therein. This junction is planar with respect to the surface of the semiconductor and extends to the surface under the oxide as shown. The diode thus formed has a zener breakdown characteristic that is established by the resistivity of the semiconductor materials forming the junction. Diffused region 27 is more heavily doped than the underlying P-type material so that the zener voltage of the diode is determined largely by the P-type doping level. As was explained above, the P-type diffusion was extended so as to pass completely through epitaxial layer 11 and therefore spread out laterally as well. This means that in region 28 of FIG. 4 the P-type material is heavily doped and is more lightly doped at regions physically remote therefrom. This means that where region 27 intersects the semiconductor surface, the P-type doping is lower than that in region 28. Thus the zener breakdown is confined to region 28 and is completely buried inside the semiconductor. Surface effects play no part in the breakdown mechanism and the exact breakdown voltage will be controlled almost entirely by the doping level established in connection with the isolation deposition step as illustrated in FIG. 2. This means that since the isolation diffusion need only act to isolate the epitaxial tubs and the doping level is not critical, it is a practical matter to select the doping level that gives the desired zener breakdown voltage.

The above description shows that the subsurface zener diode has a well controlled breakdown voltage. The breakdown current flows in region 28, which can be made relatively small and is well defined. The junction capacitance is set by the area of region 27 which can be made relatively small and has a minimum of parasitic area.

After the emitter region diffusion is employed to establish region 27, contacts are established as shown in FIG. 5. Contact holes are made through the oxide at 29 and 30 and the wafer is metallized as part of and in accordance with conventional IC processing. After metallization the metal is photolithographically contoured to establish the interconnect pattern. The metal labeled 31 and 32 will then serve as anode and cathode contacts respectively to the subsurface zener diode and can be extended over the oxide 13 to contact other parts as desired in the circuit being integrated.

While the above described preferred embodiment shows contact 23 surrounding diffused region 22, it is only necessary that only overlap area be present. Thus regions 22 and 23 could be in the form of squares or parallel stripes with a common overlapping edge.

In the structure of FIG. 5 the zener diode is fully isolated with anode and cathode contacts useful in circuit configurations. Some IC configurations employ zener diodes with their anodes connected to the substrate. This permits some structure simplification. For the substrate anode connection buried layer 12 is omitted so that diffusion 22 contacts the substrate. This means that diffusions 23 and 21 can be omitted. If a diode of reduced anode resistance is desired diffusion 23 can be employed as shown but diffusion 21 would not be needed. In this latter case a top side substrate-anode connection is available as well as reduced anode resistance.

FIG. 6 shows an alternative diode construction. The diode itself is contained in isolation diffusion region 22 as described above. All of the advantages and benefits accrue. However, isolation diffusion ring 23 is not used. It is replaced with a ring diffusion 35 which is an NPN transistor base diffusion. The dashed line of FIG. 6 at the edge of 35 denotes the extent of the diffusion. Contact between diffusions 27 and 35 is carefully avoided so as to avoid surface diode breakdown. Diffusion 35 does overlap the periphery of diffusion 22 thereby to make ohmic contact to the diode anode. Contact cuts and metallizations 31 and 32 complete the diode structure. One advantage of the diode of FIG. 6 is that better or more efficient utilization of area is achieved over that of the structure of FIG. 5. Also since less material contacts buried layer 12, the diode has lower parasitic anode to epitaxial layer capacitance. The disadvantage of the structure of FIG. 6 is that it has higher series resistance than the structure of FIG. 5.

While the above embodiments show a P-type substrate and N-type epitaxial layer, all polarities could be reversed without departing from the spirit of the invention. Also, while the diode is shown as being confined within isolation ring 21, the invention can be practiced without such isolation. For example, isolation ring 21 can be replaced with oxide isolation or an isolation etch as used in mesa construction. Also in those cases where the diode can be coupled, it can be fabricated as part of another device.

There are still other alternatives and equivalents that will occur to a person skilled in the art. Accordingly, it is intended that the scope of the invention be limited only by the claims that follow.

I claim:

1. A zener diode fabricated in a semiconductor integrated circuit structure, said integrated circuit having a substrate of one conductivity type, an overlying epitaxial layer of the opposite conductivity type, isolation diffusion regions of said one conductivity type extending completely through said epitaxial layer and acting to isolate portions of said epitaxial layer, high conductivity buried layer regions of said opposite conductivity type located under selected areas of said epitaxial layer, base diffusion regions of said one conductivity type extending partly through said epitaxial layer, and emitter diffusion regions of said opposite conductivity type extending into said expitaxial layer to a lesser extent than said base diffusions, said zener diode comprising:

a first region of said isolation diffusion extending through said epitaxial layer;

a second region of said emitter diffusion located inside said first region whereby a peripheral portion of said first region is located outside of said second region;

means for making an ohmic connection to said first region only in said peripheral portion thereof; and means for making an ohmic connection to said second region.

2. The zener diode of claim 1 further including a buried region of said opposite conductivity located under said epitaxial layer and substantially in registry with said first region whereby said diode is isolated from said substrate.

3. The zener diode of claim 1 wherein said ohmic connection to said first region includes a third region of isolation diffusion located adjacent to said first localized region so that the edges of said first and third regions overlap and said third region stops short of said second region, and a metal contact to said third region.

4. The zener diode of claim 3 wherein said third region forms a ring around said first region.

5. The zener diode of claim 1 wherein said ohmic connection to said first region includes a fourth region of said base diffusion located adjacent to said first region so that the edges of said first and fourth regions overlap and said fourth region stops short of said second region, and a metal contact to said fourth region.

6. The zener diode of claim 5 wherein said fourth region surrounds said first region.

* * * * *